United States Patent [19]

Harvey et al.

[11] Patent Number: 5,842,006
[45] Date of Patent: Nov. 24, 1998

[54] COUNTER CIRCUIT WITH MULTIPLE REGISTERS FOR SEAMLESS SIGNAL SWITCHING

[75] Inventors: Audrey F. Harvey; Jaffar Shah, both of Austin; Joseph Peck, Round Rock; Kosta Ilic, Austin, all of Tex.

[73] Assignee: National Instruments Corporation, Austin, Tex.

[21] Appl. No.: 524,068

[22] Filed: Sep. 6, 1995

[51] Int. Cl.$^6$ ....................................................... G06F 1/14
[52] U.S. Cl. .............................. 395/557; 395/559; 377/52
[58] Field of Search ..................................... 395/550, 557, 395/555, 559; 364/270, 270.2; 377/16, 52; 371/5.3, 57.2, 61, 62

[56] References Cited

U.S. PATENT DOCUMENTS

| | | | |
|---|---|---|---|
| 4,053,739 | 10/1977 | Miller et al. | 364/703 |
| 4,161,787 | 7/1979 | Groves et al. | 364/900 |
| 4,589,093 | 5/1986 | Ippolito et al. | 364/900 |
| 4,707,834 | 11/1987 | Frisch et al. | 371/20 |
| 5,471,608 | 11/1995 | Lee et al. | 395/550 |
| 5,537,664 | 7/1996 | Rowland et al. | 395/879 |

*Primary Examiner*—Dennis M. Butler
*Attorney, Agent, or Firm*—Conley, Rose & Tayon; Jeffrey C. Hood

[57] ABSTRACT

A counter circuit with multiple registers for eliminating reprogramming delays and for providing seamless switching between timing signals. In a first embodiment, two registers are preloaded with values and control logic chooses between the registers for loading a counter. The counter asserts a terminal count signal to output logic, which correspondingly asserts a convert pulse to an analog measuring circuit. The control logic receives start and stop signals and the terminal count signal, where the control logic controls operation accordingly. In this manner, a delay value is initially loaded into the counter to provide an initial delay period upon receiving the start signal, and then a scan rate value is continually loaded into the counter from another register thereafter for defining the scan rate until the start signal is received. Alternatively, first and second scan rate values are preloaded into the first and second registers, respectively, and a select signal is used as a gate signal to identify which of the scan rates to use. In this manner, the scan rate is almost immediately switched to the new rate when the gate signal is toggled to achieve seamless switching. In an alternative embodiment, multiple banks of dual registers and appropriate control and select logic define a different timing signal per register bank. In each bank the two registers define the low and high durations of the respective timing signals. Thus, the frequency and duty cycle of each timing signal is fully preprogrammed and switching from one timing signal to another occurs seamlessly without delay.

22 Claims, 8 Drawing Sheets

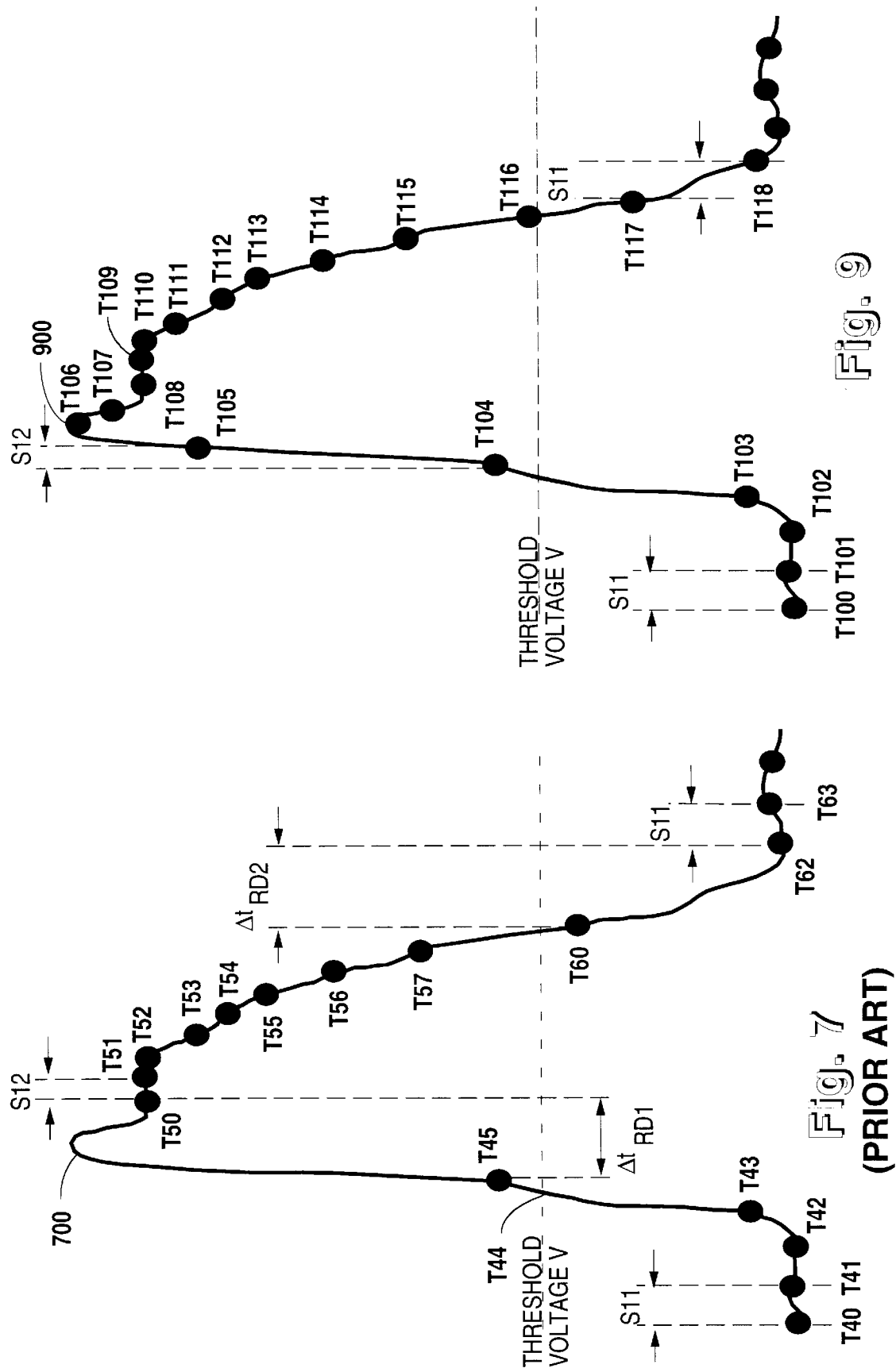

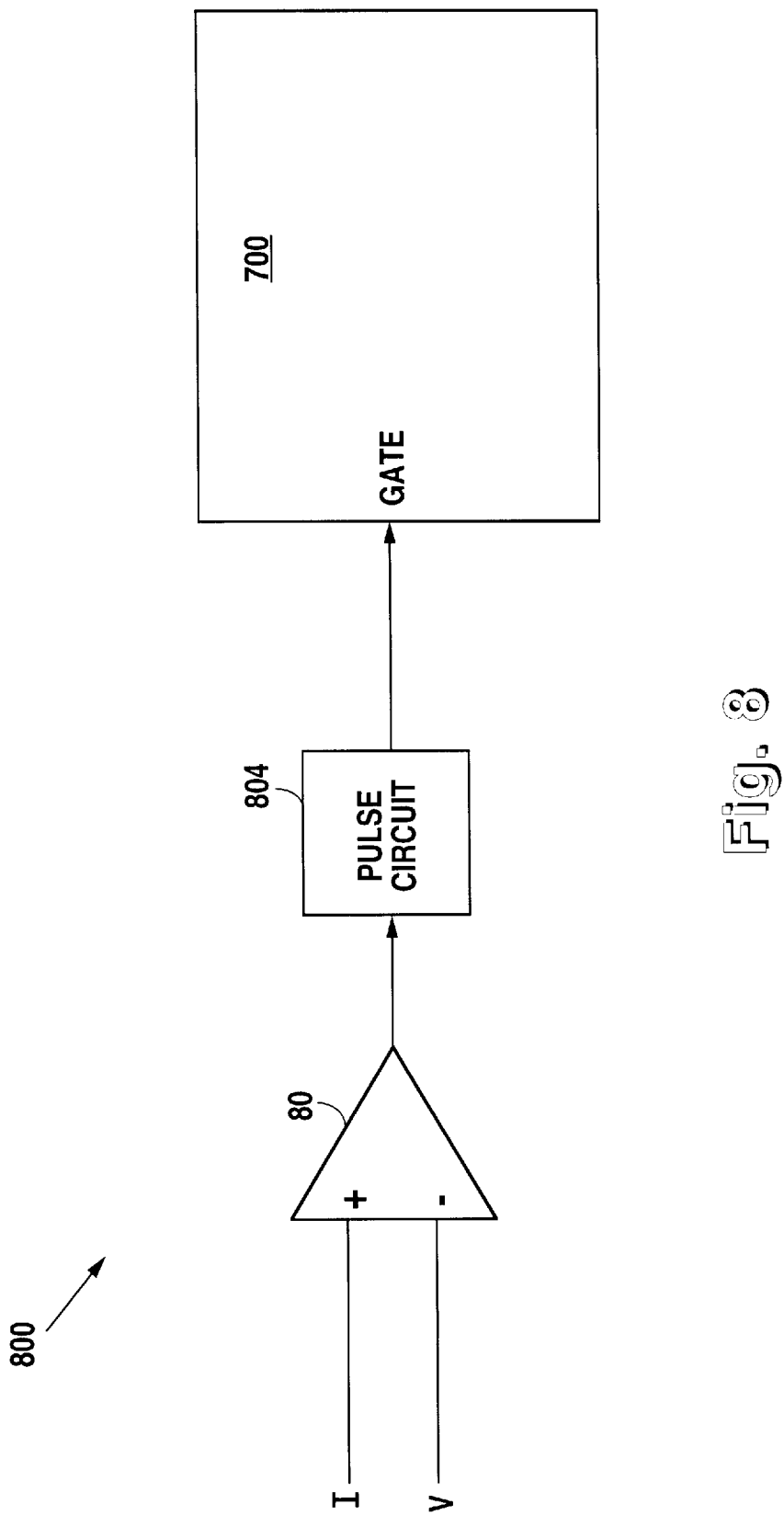

COUNTER CIRCUIT WITH MULTIPLE REGISTERS FOR SEAMLESS SIGNAL SWITCHING

FIELD OF THE INVENTION

The present invention relates to measurement systems, and more particularly to counter circuits for providing seamless, user programmable scan interval or timing signals for a data acquisition system.

DESCRIPTION OF THE RELATED ART

Scientists and engineers often use measurement systems to perform a variety of functions, including laboratory research, process monitoring and control, data logging, analytical chemistry, test and analysis of physical phenomena and control of mechanical or electrical machinery, to name a few examples. One example of hardware to implement such measuring systems is a data acquisition (DAQ) system, which typically includes transducers for measuring and providing electrical signals, signal conditioning such as amplification, isolation and filtering, and DAQ hardware for receiving digital and analog signals and providing them to a processing system, such as a personal computer. The computer may further include analysis hardware and software for analyzing and appropriately displaying the measured data. Other hardware I/O (input/output) interface options include the GPIB (general purpose interface bus), the VXI bus, and the RS-232 protocol.

A measurement system typically includes an I/O board plugged into one of the I/O slots of the processing or computer system. Generally, the processing system is an IBM AT or other IBM compatible computer system having an I/O bus and connectors or slots for receiving I/O boards. Of course, other computer systems and I/O buses may be used. The I/O board typically includes memory, such as a plurality of buffers or registers, for temporarily storing data values to be provided to the computer. A typical DAQ system performs a plurality of functions, such as sampling analog and digital signals and also for generating synchronization or timing signals. Thus, several different sections are provided in a DAQ system, such as an analog section for sampling analog input signals and also general purpose timers and counters, which are programmable for generating a plurality of synchronization and timing signals, depending upon the unit or physical phenomena being measured or otherwise tested.

For example, a DAQ system typically includes an analog input section for sampling analog signals at certain scan intervals and converting the sampled voltage to a binary or digital signal using an analog to digital (A/D) converter. The digital data may further be filtered or otherwise processed and then provided to the computer for further processing and display. The analog input signal is sampled at certain intervals or at a particular scan rate typically defined by a pulse train signal provided by a counter loaded with a predetermined value. The counter may be any one of several types, such as a count-up or count-down timer, which asserts a terminal count signal to an output circuit which provides a pulse train signal to the analog measuring circuit. Thus, the analog measuring circuit takes samples with each pulse of the pulse train signal.

A primary problem with a measurement system such as that described above is indeterminate timing delays while programming the counter. Typically, software is used to determine a certain value defining the scan rate which is then loaded into the counter each time terminal count is reached. Furthermore, a gate or trigger signal indicating an event is asserted before measurement begins. It is often desired to provide a delay before asserting the first pulse of the pulse train signal. However, it is rather difficult and often not even possible to accurately program the delay using software techniques.

A similar problem arises while sampling an analog signal or a plurality of signals at a plurality of scan rates. For example, it may be desired to sample an analog signal at a first scan rate while the analog signal is below a predetermined threshold voltage and then to sample the analog signal at a different scan rate when it rises above the threshold voltage. Because of programming delays required for reprogramming the counter for switching between the first and second scan rates, an indeterminate delay is inserted each time scan switching is desired. In this case, delays are not desired at all since the analog signal cannot be measured during such delay during reprogramming. The indeterminate delays lead to inaccuracies and less accurate results for the measurement system.

The general purpose counters and timers are often used for a variety of functions such as generating synchronization or timing signals for synchronizing two different measurements or channels of a measurement system. Such signals may have variable frequencies and duty cycles which are typically programmed through software. Again, such software programming is very tedious and is not always as accurate as desired.

Therefore, it is desired to provide a DAQ system which is fully programmable to generate synchronization pulse train and timing signals without indeterminable programming delays. It is further desired to provide seamless signals completely defined and programmable. Furthermore, it is desired to provide such a programmable DAQ system without requiring programming complications and without substantial cost for implementation.

SUMMARY OF THE INVENTION

A counter circuit with multiple registers according to the present invention eliminates substantial programming requirements and provides seamless scan rate and timing signals. In a first embodiment according to the present invention, select logic selects between two programmable registers and provides the selected output to a programmable timing device, such as a counter. The counter asserts a terminal count signal when counting is completed. Output conditioning logic receives the terminal count signal and correspondingly asserts a pulse to an analog measurement system or any other measurement system desired. The analog measurement system preferably samples an input signal upon receiving each pulse. Although a computer system may ultimately control the counter circuit, control logic may also be provided for loading the registers, providing the select signal to the select logic, loading and enabling or disabling the counter and receiving the terminal count signal. A predetermined delay value is loaded into one register and a scan interval value is loaded into the other to complete programming.

In one embodiment according to the present invention, the computer system provides a predetermined delay value and a scan interval value, which values are loaded into respective registers of the counter circuit. The delay value is initially loaded into the counter. A start signal initiates operation where the counter counts using the delay value until finished counting, at which time it asserts a terminal count signal indicating completion. The control logic then loads the counter with the scan interval value from the second register to immediately begin a series of scan intervals. The control logic repeatedly reloads the counter with the scan interval value from the second register upon successive terminal counts for as long as a train of scan signal pulses is desired. A stop signal is provided to temporarily suspend operation for a new scan interval cycle. The delay value is reloaded into the counter from the first counter before the next scan value from the internal cycle. The circuit is thus prepared for the next set of measurements. In this manner, the delay period and the scan interval are both completely programmable and a circuit according to the present invention provides a seamless pulse train signal without any indeterminate programming delays. Furthermore, once the delay and scan interval values are loaded into the registers, reprogramming is not necessary during operation.

In an alternative use of the embodiment described above, the first register is loaded with a first scan interval value and the second register is loaded with a second scan interval value for providing two separate scan intervals. In the preferred embodiment, the level of a select signal to multiplexer logic acts as a gate signal for determining which of the registers is selected. For example, while the select signal is at one logic level, the counter circuit selects one of the registers and continually scans an input signal at a first scan rate. Upon the occurrence of a certain event while taking measurements at the first scan rate, such as the analog signal being monitored or sampled crossing a certain predetermined threshold voltage, the select signal is toggled and the second input register is selected for loading the counter with the second scan rate. The circuit thus immediately switches to the second scan rate without any programming delays in the interim. The resulting output pulse train signal is completely seamless and allows for significantly enhanced accuracy in measurement.

An alternative embodiment of the present invention may be used in the general purpose counters and timers section of a DAQ system for providing a system for completely programmable synchronization or timing signals. A plurality of separate banks of dual registers are provided through select logic to the counter. Control logic selects between the register banks for loading values into the counter and also receives a gate signal for switching between the register banks. A first bank of registers includes two registers for storing two different timing values defining the frequency and duty cycle of a first programmable signal. A second bank also includes two registers for storing two values for defining a second signal with a different frequency and duty cycle. Of course, additional banks of registers may be included as desired depending on the number of timing signals required. Multiplexer select logic controlled by control logic selects between the banks of registers. For example, when the gate signal is first pulsed, a first bank is selected by the control logic for providing a first timing signal at the output. In particular, one register of the first bank defines the time period that the output signal is asserted low, while the second register defines the time period that the output signal is asserted high, thereby defining the frequency and duty cycle of the output signal. When the gate signal is pulsed again, a second bank of registers is selected with two new values for defining a new frequency and duty cycle of the output signal. Meanwhile, the first register bank is reprogrammed with new values for a third timing signal if desired. It is noted that only two register banks are required for most applications since one register bank is reprogrammed while the other is selected.

Output conditioning logic receives the terminal count signal from the counter and toggles its output rather than asserting a pulse. In this manner, the output signal is completely programmable between two separate output timing signals without any indeterminate reprogramming delays, thereby achieving seamless switching between the two separate timing signals. In yet further embodiments, comparator logic is provided for monitoring field signals for detecting important timing events. Such extra hardware provides very fast switching between timing events. Also, counter circuits can be cascaded as desired, so that one circuit provides the controlling gate or trigger signal to the next.

It is clear that the embodiments described above implemented in a DAQ system provides fully programmable and seamless synchronization pulse trains and timing signals without indeterminate programming delays. Such implementation allows substantially simplified programming and reduced cost.

BRIEF DESCRIPTION OF THE DRAWINGS

A better understanding of the present invention can be obtained when the following detailed description of the preferred embodiment is considered in conjunction with the following drawings, which:

FIG. 7 is a timing diagram illustrating switching between two separate scan rates using a circuit according to prior art;

FIG. 8 is a simplified schematic diagram including the counter circuit of FIG. 5 and comparator logic for monitoring a voltage signal and for switching between two separate scan rates according to yet another embodiment of the present invention; and FIG. 9 is a timing diagram illustrating an example of switching between two separate scan rate intervals using the circuit of FIG. 8.

DETAILED DESCRIPTION OF THE PREFERRED EMBODIMENT

Figure 1:
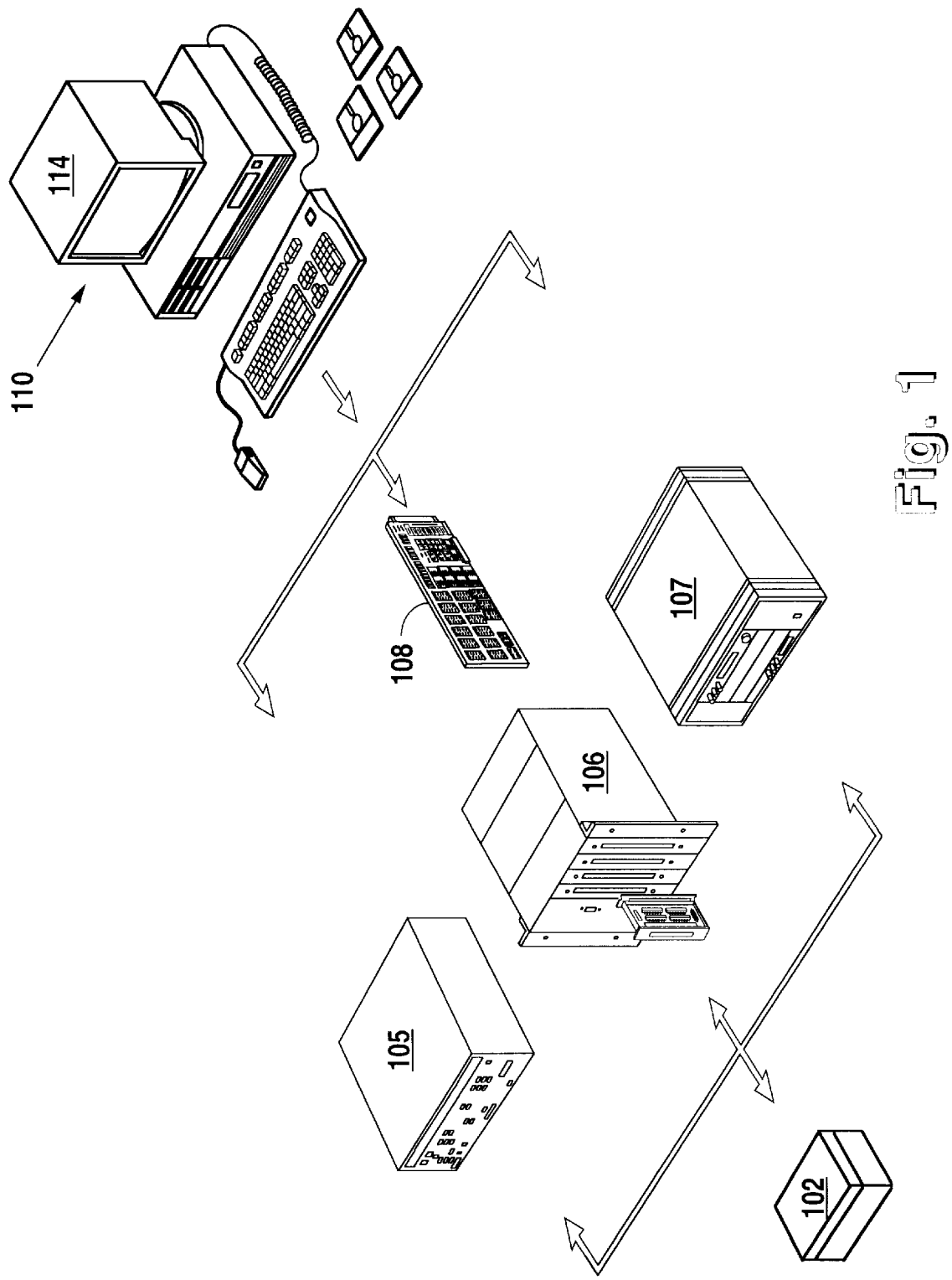
FIG. 1 is a perspective view of an instrumentation system including a DAQ system according to the present invention.

Referring now to FIG. 1, a perspective diagram of an instrumentation system is shown including a data acquisition (DAQ) system according to the present invention. A unit under test (UUT) 102 generally represents a process or other physical phenomena being monitored, including transducers or other sensing devices for detecting or measuring temperature, pressure, voltage, etc. For example, it may be desired to sense the on/off state of power circuits, proximity switches, relays, etc. to measure certain timing events or to measure the voltage levels of one or more analog signals.

The sensing devices provide field signals to signal conditioning instruments 106, which generally isolates the field signals and otherwise amplifies, reduces, or filters the field signals to provide corresponding digital signals to a DAQ board 108 including a circuit according to the present invention. The DAQ board 108 is preferably comprised in a computer system 110 or is coupled to the computer system 110. The instrumentation system may also include a GPIB (General Purpose Interface Bus) and related instruments 105 and/or a VXI chassis 107 and VXI instruments.

The DAQ board 108 includes a plurality of channels and the appropriate circuitry for collecting all of the data provided by the signal conditioning instruments 106 and to provide this collected data to the I/O bus 112 of the computer system 110. The computer system 110 includes the appropriate software for controlling the DAQ board 108, performing analysis of the collected data and a display 114 for displaying the analyzed data in a desirable or understandable format. The present invention primarily concerns the circuitry of the DAQ board 108, although in some embodiments software routines operating on the computer system 110 serve to control the hardware on the DAQ board 108.

Figure 2:
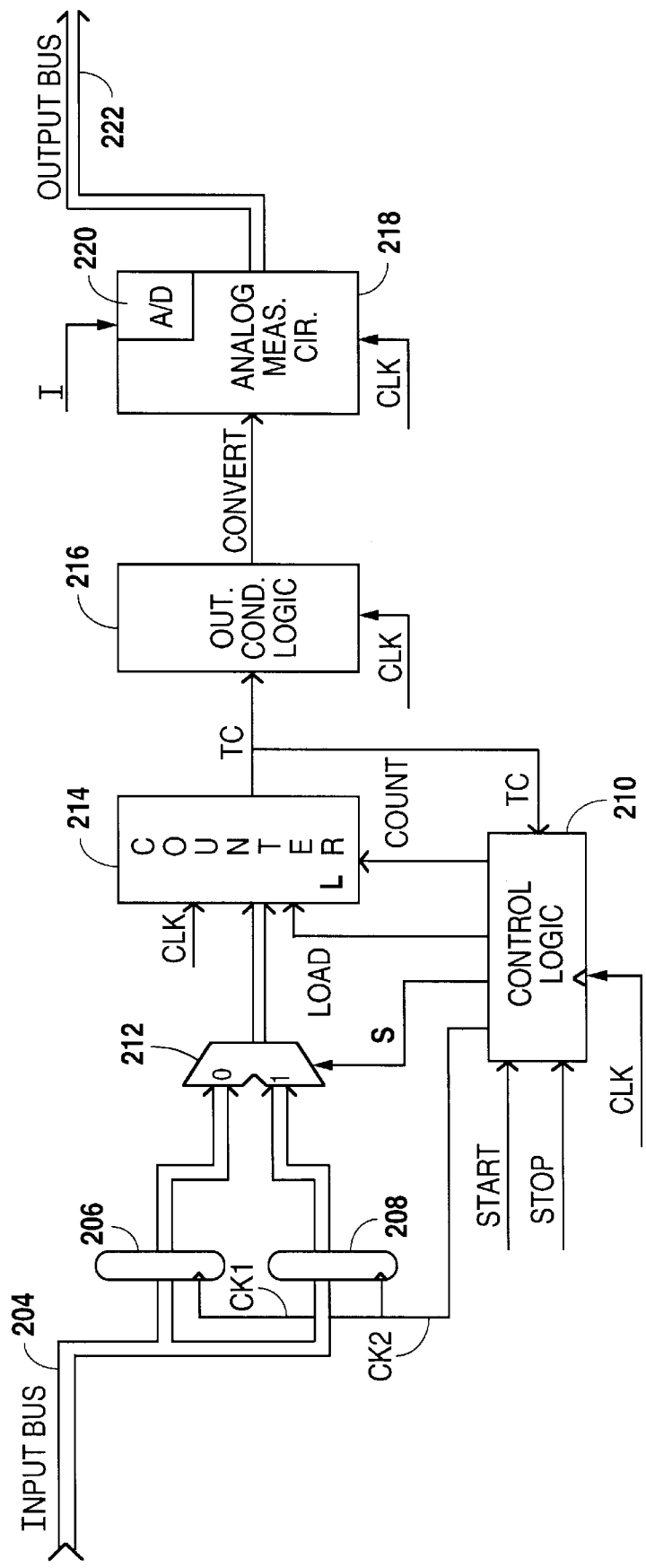
FIG. 2 is a simplified block diagram of one embodiment of a counter circuit with multiple registers according to the present invention.

Referring now to FIG. 2, a simplified block diagram is shown of one embodiment of a counter circuit 200 according to the present invention, which is preferably provided on the DAQ board 108. A software routine operating on the computer system 110 generally controls the counter circuit 200, although additional hardware could be included to provide control for applications requiring faster loop response, if desired. The computer system 110 or other control circuitry provides data on an input bus 204 to the input of two registers 206, 208, where the input bus 204 preferably comprises a portion of the I/O bus 112. Although registers are typically used, other comparable memory storage devices are contemplated, preferably digital memory devices. The registers 206, 208 are of any appropriate size depending upon the particular implementation, including 8, 16, 24, 32, etc. bits. The registers 206, 208 both receive respective clock signals CK1, CK2 from control logic 210 for loading the respective registers 206, 208 from the input bus 204, where the CK1 and CK2 clock signals are preferably synchronized to a master clock signal CLK provided from the computer system 110. Alternatively, the computer system 110 could directly provide separate strobe signals to clock the registers 206, 208 as desired. The outputs of both of the registers 206, 208 are provided to the respective inputs of a two-input multiplexer (mux) 212 receiving a select signal S from a plurality of sources including the computer system 110 and the control logic 210. Other sources for providing the S signal may include another counter circuit of the instrumentation system, or a separate external hardware or software system controlling scan interval timing. The mux 212 is the appropriate bit size for the registers 206, 208, such as 8, 16, 24, 32, etc. Bits.

In general, when the S signal is asserted low, the register 206 is selected so that the mux 212 asserts output signals corresponding to the contents of the register 206 to the input of a counter 214. A counter is used in the disclosed embodiment, although comparable programmable timing devices are contemplated. When the S signal is asserted high, the register 208 is selected for loading its contents into the counter 214. The counter 214 is any desired bit size corresponding to the registers 206, 208 and the mux 212, and is preferably a down counter, but could alternatively be implemented as a count-up timer or any other timer implementation as known to those skilled in the art.

The control logic 210 receives the CLK signal, START and STOP signals from the computer system 110 and also a terminal count signal TC from the counter 214. The START and STOP signals are preferably asserted by the computer system 110 but could also be provided from any one of multiple sources in a similar manner as the S signal, such as from another counter circuit or from external circuitry. The control logic 210 preferably asserts a signal LOAD to the counter 214 for loading the data provided from the mux 212, and also asserts a signal COUNT to start and stop the counter 214. Upon reaching zero or otherwise when finished counting, the counter 214 asserts the TC signal, which is also provided to output conditioning logic 216. The control logic 210 generally pulses the LOAD signal upon receiving a pulse of the TC signal to reload the counter 214 with a selected value, although the LOAD signal may also be provided from the computer system 110 or from any one of multiple sources as desired. The START and STOP signals are generally asserted by the computer system 110 for starting and stopping, respectively, each series of scan intervals as further described below. The START signal generally acts as a trigger or strobe signal to initiate timing operations. Generally, the control logic 210 asserts the COUNT signal upon receiving a pulse on the START signal, and negates the COUNT signal upon receiving a pulse on the STOP signal.

The output conditioning logic 216 receives the TC signal and correspondingly asserts a scan interval signal, referred to as CONVERT, to an analog measurement system 218. The analog measurement system 218 receives an input signal I, which is generally an analog signal generated by the UUT 102 being monitored by the DAQ board 108. In the preferred embodiment, the output conditioning logic 216 asserts a pulse on the CONVERT signal when the TC signal is pulsed or otherwise asserted, where the analog measurement system 218 correspondingly samples the voltage of the I input signal. Preferably, the analog measurement system 218 includes an analog to digital (A/D) converter 220 which converts the sampled voltage of the I input signal to a binary or digital value. The analog measurement system 218 subsequently provides the sampled data on an output bus 222, which is preferably coupled to the I/O bus 112 of the computer system 110.

Figure 3:
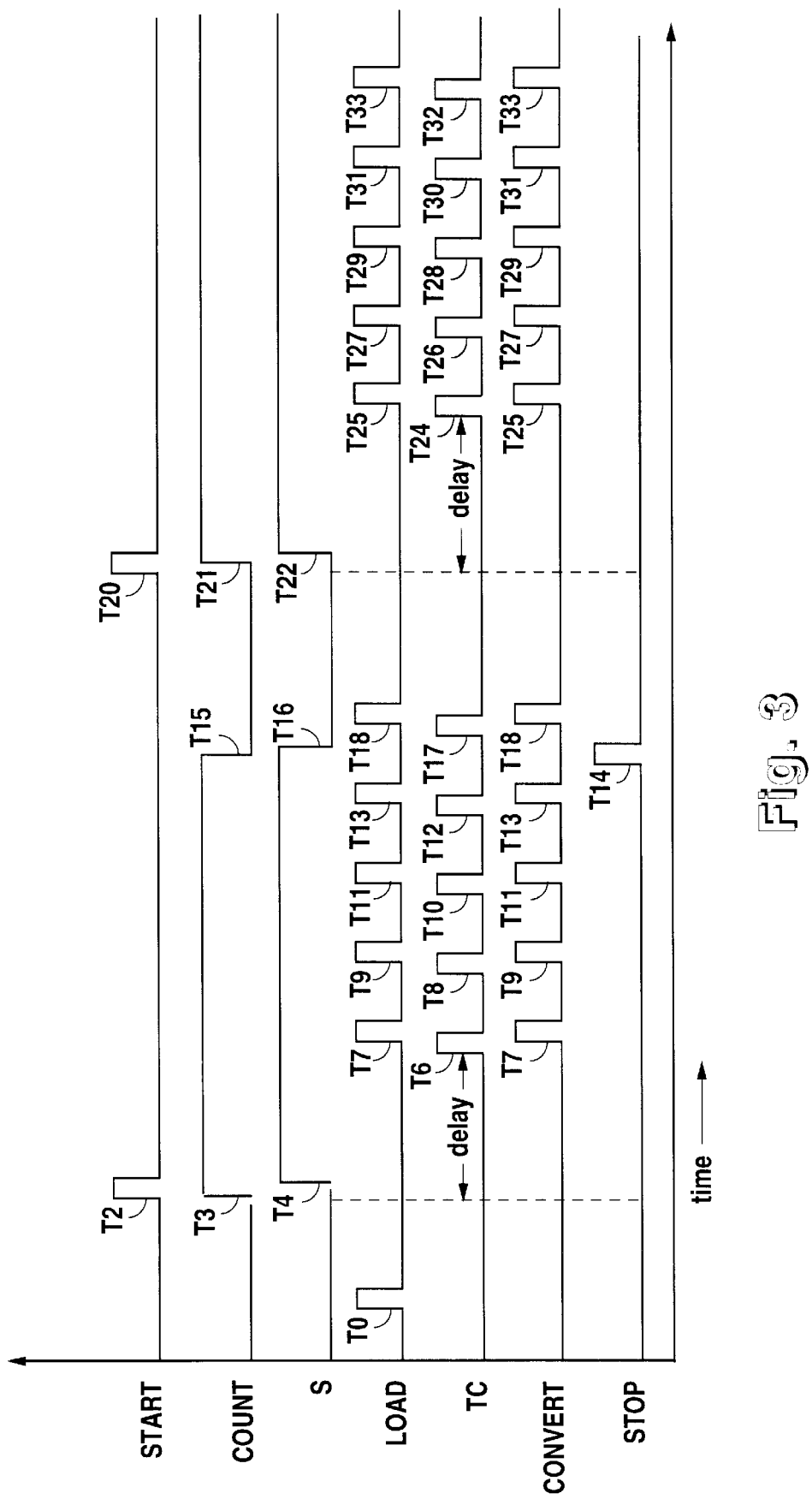
FIG. 3 is a timing diagram illustrating operation of the circuit of FIG. 2 according to one embodiment of the present invention.

Referring now to FIG. 3, a timing diagram is shown illustrating operation of the counter circuit 200 shown in FIG. 2. Preliminarily, the computer system 110 provides a digital delay value on the input bus 204 and the control logic 210 asserts the CK1 signal for loading the delay value into the register 206. The computer system 110 also provides a digital scan interval value on the input bus 204, and the control logic 210 asserts the CK2 signal to load the scan interval value into the register 208. The counter circuit 200 is now considered programmed for providing a seamless stream of pulses on the CONVERT signal. The S signal is initially set low for selecting the delay value from the register 206, and the LOAD signal is asserted to load the delay value into the counter 214 at a time T0. This initial assertion of the LOAD signal is typically made by the computer system 110.

The computer system 110 or other circuitry asserts the START signal at a time T2 to begin operation of the counter circuit 200. The control logic 210 respondingly asserts the COUNT signal at time T3, or after a negligible hardware delay from time T2, and the counter 214 begins counting. The control logic 210 also asserts the S signal at time T4 to select the scan interval value from the register 208, where the S signal is asserted either in response to the assertion of the COUNT signal or is asserted any time before the counter 214 completes counting. The counter 214 finishes counting and asserts the TC signal at time T6 after a delay time corresponding to the delay value and the CLK signal. In response, the control logic 210 asserts the LOAD signal at time T7 to load the counter 214 with the scan interval value from the register 208. The LOAD signal is only pulsed long enough to load the scan interval value, so that the counter 214 almost immediately begins counting again since the COUNT signal remains asserted, but this time from the interval scan value. It is noted that the size of the pulse signals depicted in the FIGS. are enhanced for clarity. Also, the output conditioning logic 216 asserts a pulse on the CONVERT signal at about time T7 in response to the TC signal pulse, where the CONVERT pulse is detected by the analog measurement system 218, which correspondingly samples the I input signal. It is noted that the time T7 occurs after time T6 after a negligible hardware delay.

The counter 214 completes counting and asserts the TC signal at time T8 after a scan interval time defined by the CLK signal and the scan interval value from the register 208. Again, the LOAD signal is pulsed in response to the TC signal at time T9 after the hardware delay, so that the counter 214 is reloaded with the scan interval value from the register 208 and begins counting. Also, the output conditioning logic 216 asserts a pulse on the CONVERT signal at time T9 causing the analog measurement circuit to take a new sample of the I signal. Operation continues in like manner for another two pulses of the TC signal at times T10 and T12 each after the scan interval time, and corresponding pulses on both the CONVERT and LOAD signals at times T11 and T13.

Eventually at a time T14, the computer system 110 or other external device asserts the STOP signal to stop counting and to suspend operation of the counter circuit 200. The control logic 210 correspondingly negates the COUNT signal low at time T15 to suspend the counter 214. Also, the control logic 214 asserts the S signal low at time T16 to select the delay value from the register 206 to begin another series of scan intervals. The LOAD signal is then asserted or pulsed after the S signal is asserted low at time T18 to load the counter 214 with the delay value from the register 206. The LOAD signal could be asserted by the control logic 210 in response to the STOP and S signals, or could alternatively be asserted by the computer system 110 before a new scan interval is initiated. The present invention is not limited by any particular configuration of the control logic 210 or operation of the computer system 110. Subsequently at time T20, the START signal is asserted to begin a new scan interval cycle. Again, the COUNT and S signals are respondingly asserted high at times T21 and T22, respectively, to initiate the counter 214 and to select the scan interval value as described previously. After the delay time, the TC signal is asserted at time T24 and corresponding pulses are subsequently asserted on the LOAD and CONVERT signals at time T25. Operation continues in like manner as described before, where subsequent pulses are asserted on the TC signal at times T26, T28, T30 and T32 after the scan interval time, and corresponding pulses are asserted on the LOAD and CONVERT signals at times T27, T29, T31 and T33, respectively.

It is now appreciated that the use of dual registers 206, 208 allows preprogramming of the delay and scan interval values to eliminate indeterminate reprogramming delays. The counter circuit 200 simply loads the counter 214 from the appropriate register depending upon the S and TC signals.

Figure 4:
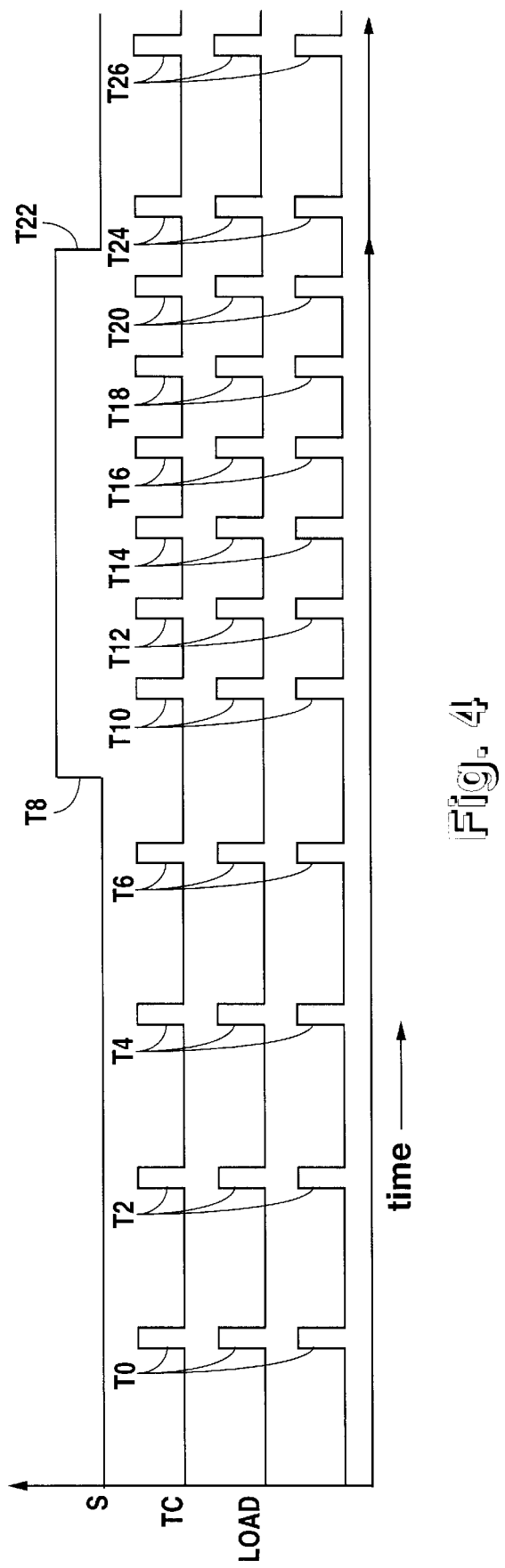
FIG. 4 is a timing diagram illustrating operation of the circuit of FIG. 2 for switching between two separate scan rates according to another embodiment of the present invention.

Referring now to FIG. 4, a timing diagram is shown illustrating an alternative use of the counter circuit 200 to provide seamless switching between two separate scan rates. The use of two separate scan rates provides benefit in a plurality of different situations, such as measuring an analog signal at one rate when below a certain voltage threshold and measuring at a second rate when the analog signal rises above the voltage threshold. Initially, the computer system 110 loads the registers 206, 208 with two separate scan interval values in a similar manner as described above. The START and STOP signals are used to start and stop the counter 214 as described previously, but will not be shown for purposes of clarity. It will be assumed that the START signal was previously asserted so that the counter 214 is continuously counting after each successive load. Hardware delays are considered negligible and will be ignored. The S signal is used as a gate signal to switch between the two scan rate values. Alternatively, the START or another trigger signal may be pulsed to toggle the S signal for switching. Initially, the S signal is low, where the TC signal is asserted at time T0 and pulses are subsequently asserted on the LOAD and CONVERT signals. The counter 214 is loaded with the first scan rate value from the register 206 and begins counting again. Operation continues in like manner with pulses on the TC, LOAD and CONVERT signals at times T2, T4 and T6 as shown. In this manner, the CONVERT signal is pulsed at the first scan interval rate associated with the first scan interval value continually loaded from the register 206 while the S gate signal is asserted low.

At time T8 during a scan interval, the S signal is asserted high. Since the S signal has no immediate effect on the counter 214, it continues to count down with the first scan rate until asserting the TC signal at time T10, at which time another pulse occurs on the LOAD and CONVERT signals. This time, however, the second scan interval value from the register 208 is loaded into the counter 214. While the S signal is asserted high, the counter 214 continually counts down and asserts the TC signal upon terminal count and is reloaded with the second scan interval value from the register 208. Thus, pulses occur on the TC, LOAD and CONVERT signals at subsequent times T12, T14, T16, T18 and T20. In this manner, the CONVERT signal is pulsed at the second scan interval rate while the S signal is asserted high. Then, at time T22, the S signal is asserted low. The counter 214 continues to count down and asserts the TC signal at time T24. This time, the counter 214 is loaded with the first scan interval value from the register 206 as described above.

It is now appreciated that the counter circuit 200 can be used to seamlessly switch between two separate scan rates using a gate or select signal to switch between the two rates. No reprogramming delays or extra counters are required. The S signal can be asserted by any one of several sources including the computer system 110, another counter circuit, external hardware, etc.

Figure 5:
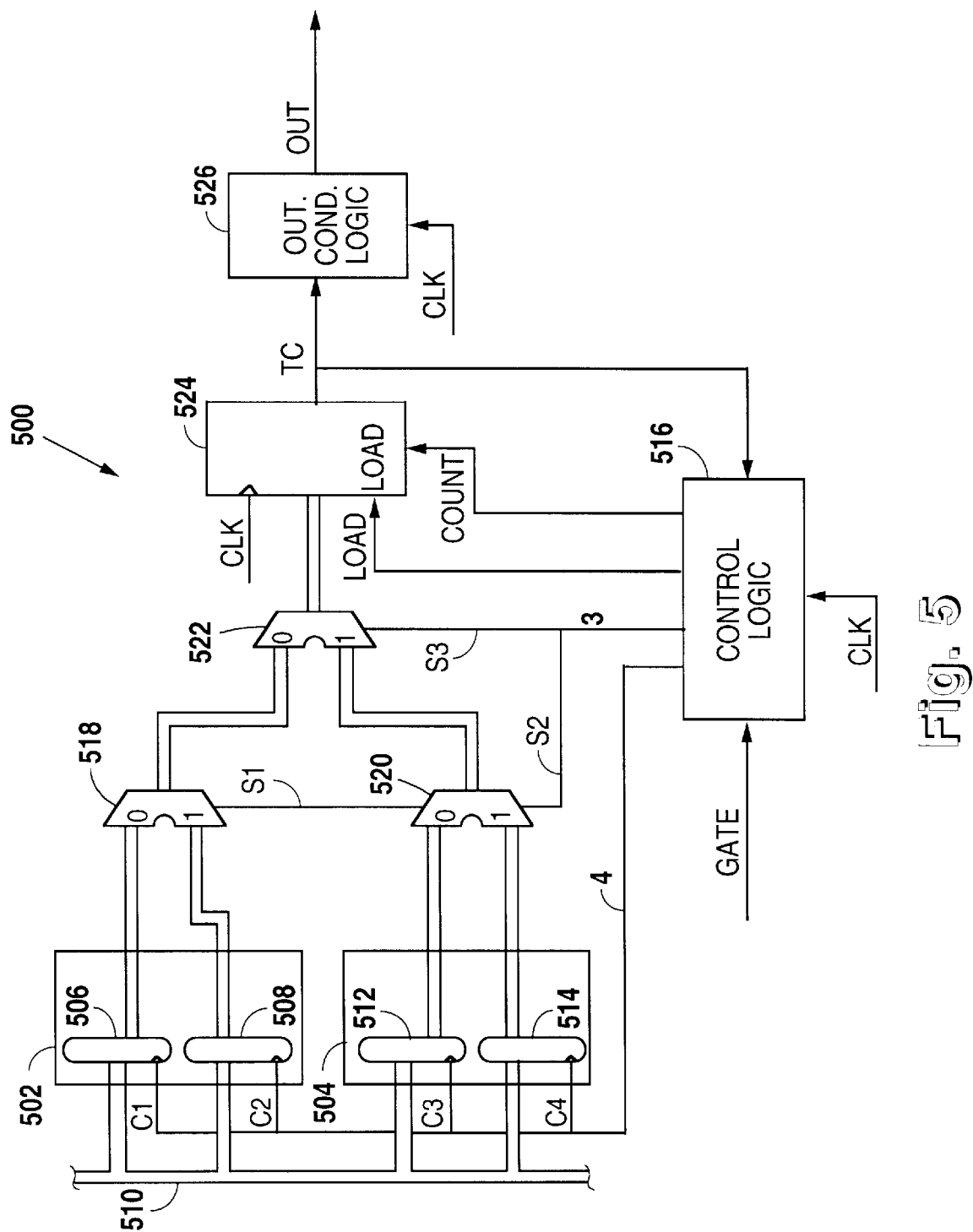
FIG. 5 is a simplified block diagram of an alternative embodiment of a counter circuit according to the present invention.

Referring now to FIG. 5, a simplified block diagram is shown of an alternative embodiment of a counter circuit according to the present invention. A counter circuit 500 is similar to the counter circuit 200, except that the counter circuit 500 includes two banks 502, 504, where each of the register banks 502, 504 include two separate registers similar to the registers 207, 208 of the counter circuit 200. In particular, the register bank 502 includes registers 507 and 508 having inputs coupled to an input bus 510 and the register bank 504 includes two registers 512 and 514 having inputs also connected to the input bus 510. The input bus 510 is preferably coupled to the I/O bus 112 of the computer system 110.

The registers 506, 508, 512 and 514 receive respective clock signals C1, C2, C3 and C4 from a control logic block 516, which also asserts select signals S1 and S2 to two two-input muxes 518 and 520, respectively. The two inputs of the mux 518 are connected to the respective outputs of the registers 506 and 508 and the two inputs of the mux 520 are connected to the respective outputs of the registers 512 and 514. The outputs of the muxes 518 and 520 are provided to the two inputs of a two-input mux 522, respectively, which receives a select signal S3 from the control logic 516. The control logic 516 provides a LOAD and a COUNT signal to a counter 524 in a similar manner as described previously, where the counter 524 asserts a terminal count signal TC upon completion of counting to the control logic 516 and to output conditioning logic 526. The COUNT signal is generally used to enable or disable the counter 524. The control logic 516 also receives a GATE signal from the computer system 110 or from any one of other multiple sources, such as another counter circuit or external logic. As will be described below, a pulse on the GATE signal causes switching between the register banks 502 and 504, so that the GATE signal serves as a trigger signal for switching purposes. A master clock signal CLK is provided to the registers 506, 508, 512 and 514, the counter 524, the control logic 516 and the output conditioning logic 526. The clock signals C1, C2, C3 and C4 are preferably synchronized to the clock signal CLK. The bit sizes of the registers 506, 508, 512, 514, the muxes 518, 520, 522 and the counter 524 are any desired and compatible size, such as 8, 16, 24, 32, etc.

The S3 signal is generally toggled in response to a pulse on the GATE signal for selecting between the register banks 502, 504. The S1 and S2 signals are preferably toggled with every assertion of the TC signal to alternate between the registers of the selected register bank. The LOAD signal is pulsed with each assertion of the TC signal. Again, the S1, S2 and S3 select signals, the COUNT signal and LOAD signal may be asserted by one or more sources as described previously.

The counter circuit 500 is preferably used in the general counter timer portion of the DAQ board 108 for providing a programmable synchronization signal called OUT. The output conditioning logic 526 can toggle the OUT signal upon each pulse of the TC signal, in addition to providing a pulse signal as was previously described for the CONVERT signal of FIG. 2. In this manner, values placed into the registers 506, 508, 512 and 514 of the register banks 502 and 504 provide separate timing or synchronization signals with desired frequencies. For example, values A, B, C and D could be loaded in the respective registers 506, 508, 512 and 514, where the values A and B define the frequency and duty cycle of a first signal and the values C and D define the frequency and duty cycle of a second signal. The register bank 502 is selected for providing the first signal associated with the values A and B, and then the register bank 504 is selected for providing the second signal associated with the values C and D. Meanwhile, the registers 506 and 508 could be reprogrammed with new values E and F for a third signal having a new frequency and duty cycle. In this manner, an indefinite number of synchronization signals could be programmed and provided by the counter circuit 500 with seamless operation.

Figure 6:
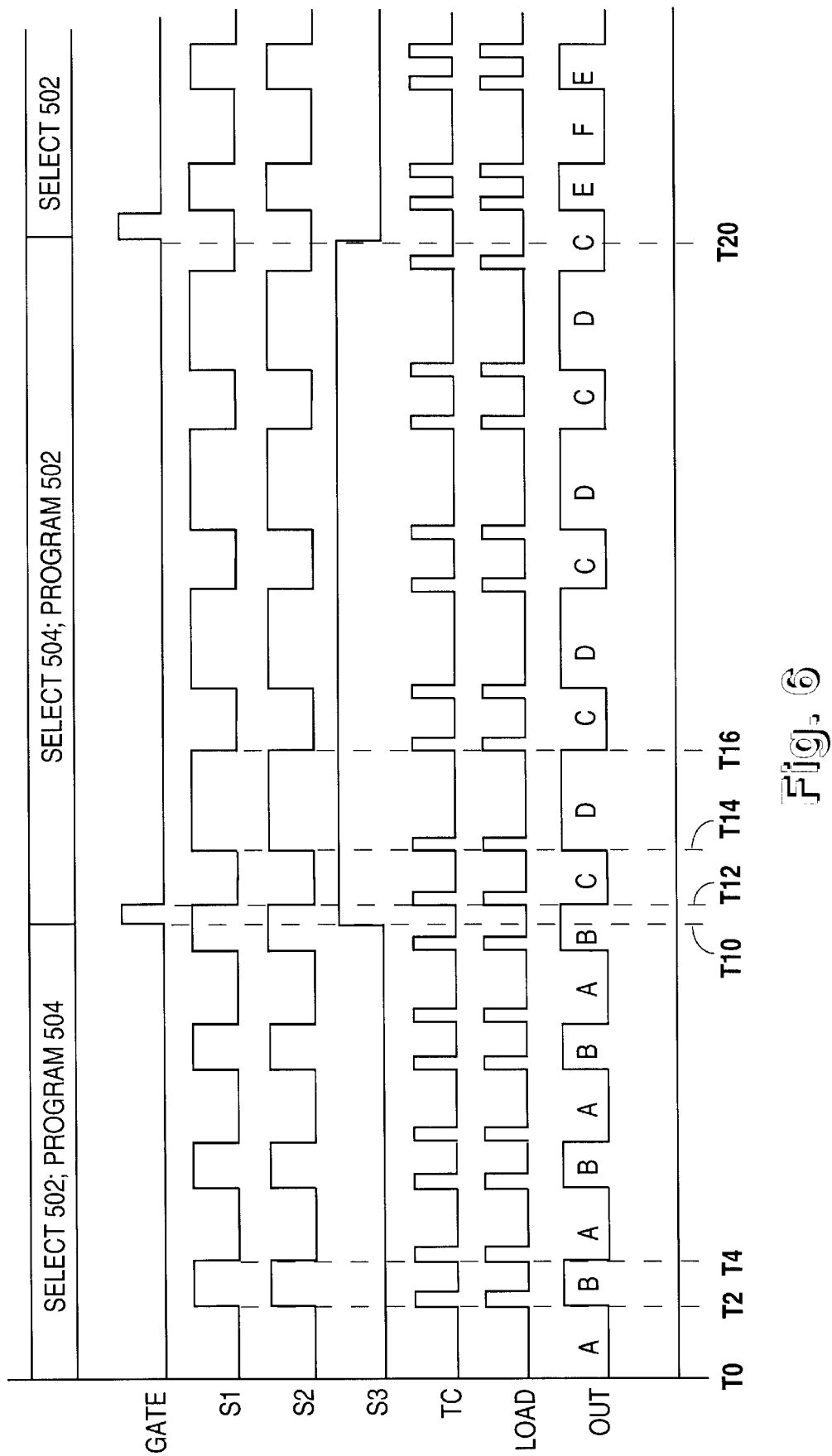
FIG. 6 is a timing diagram illustrating operation of the counter circuit of FIG. 5 according to another embodiment of the present invention.

Referring now to FIG. 6, a timing diagram is shown illustrating operation of the counter circuit 500 for asserting two or more timing signals at the output. Hardware delays are considered negligible and will be ignored. The GATE and S3 signals are initially asserted low or to zero to select the register bank 502. The control logic 516 toggles the S1 signal upon subsequent pulses of the TC signal when the counter 524 reaches terminal count. In this manner, at time T0 the GATE signal is low, the S1 signal and S3 signals are initially asserted low and counter 524 is counting down from previously loaded into it. The counter 524 eventually reaches terminal count and reasserts the TC signal at approximately a time T2 so that the output conditioning logic 526 asserts the OUT signal high and the control logic 516 asserts the LOAD signal and toggles the S1 signal high to select the B value from the register 508. Thus, the B value from the register 508 is loaded into the counter 524, which begins counting down. Upon the next terminal count of the counter 524 at time T4, the TC signal is pulsed and the output conditioning logic 526 toggles the OUT signal low while the control logic 516 toggles the S1 signal to select the A value from the register 506 once again.

Operation continues in like manner alternating between the A and B values of register bank 502 until the GATE signal is pulsed at a time T10 while the counter 524 is still counting down from value B. As described previously, the counter circuit 500 does not immediately respond until after terminal count is next reached, although the control logic 516 could easily be implemented to respond right away. The control logic 516 asserts the S3 signal to select the register bank 504. The S2 signal is toggled upon subsequent pulses of the TC signal in a similar manner as described for the S1 signal. At subsequent time T12, the counter 524 reaches terminal count and asserts the TC signal. Since the S3 signal is high and the S2 signal is low, the control logic 516 loads the C value from the register 512 into the counter 524 and the OUT signal is toggled low. Then, the counter 524 reaches terminal count at a time T14, causing the control logic 516 to select the register 514 for loading the D value into the counter 524. Meanwhile, the output conditioning logic 526 toggles the OUT signal high and the counter 524 begins counting down from the value D. At time T16 the counter 524 reaches terminal count and the output conditioning logic 526 toggles the OUT signal low and the control logic 516 selects the C value from the register 512 for loading into the counter 524. Operation continues in this manner so that the counter circuit 500 asserts a second timing signal with a different frequency and duty cycle.

Meanwhile, the non-selected counters 506 and 508 may be reprogrammed and loaded with new values E and F defining a third signal. Thus at time T20, the GATE signal is pulsed causing the S3 signal to toggle low for selecting the register bank 502. When the counter 524 next reaches terminal count and asserts the TC signal, the values E and F are alternatively loaded for providing the third signal on the OUT signal in a similar manner as described for the A, B and C, D values. Again, the register bank 504 may be reprogrammed to define yet another timing signal while the register bank 502 is selected. Operation continues in this manner for providing an indefinite number of timing signals, and switching between the timing signals in a seamless manner.

It is understood that the counter circuit 500 is easily generalized by adding a plurality of register banks similar to the register banks 502 and 504, so that a plurality of different synchronization or timing signals are provided based upon two or more GATE signals provided to the control logic 516. Of course, the control logic 516 is generalized to include several more select signals for choosing select logic appropriate for the plurality of register banks. In this manner, any number of synchronization or timing signals are predefined by pre-programming the respective register banks. Switching between the timing signals is essentially seamless since switching from one register bank to another is performed very quickly in hardware.

A measurement system has a general purpose counters and timers section which would include multiple counter circuits like the counter circuit 500 shown in FIG. 5. In one embodiment, one such counter circuit has its output providing the input gate signal to another in cascade fashion. The first controlling counter circuit pulses the GATE signal based on one or more measured timing parameters for controlling the second counter circuit.

The counter circuit 500 may also be used to seamlessly switch between two scan interval rates. Before describing operation according to the present invention, operation and associated timing problems of a circuit according to prior art will be described. Referring now to FIG. 7, an analog input signal I is measured at a first scan rate having a sample or scan interval referred to as SI1 when below a certain voltage threshold V, where it is desired to increase the scan frequency by reducing time between samples to a smaller scan interval, referred to as SI2, when the voltage of the signal I climbs above a predetermined voltage threshold V. A circuit according to prior art samples the input signal I at times T40, T41, T42, and T43 while the I signal is below the voltage threshold V. At a time T44, the I signal rises above the threshold V which is subsequently detected by the prior art circuit at a time T45, causing the prior art circuit to program a new sampling interval SI2. This causes a substantial delay referred to as $\Delta t_{RD1}$ which is a delay due to the amount of time it takes to reprogram the prior art circuitry with the new sample interval SI2. The programming delay $\Delta t_{RD1}$ is not defined and may depend upon certain programming conditions and thus is considered indeterminate. Eventually, the reprogramming is complete and sampling continues at a time T50 after the time interval $\Delta t_{RD1}$ due to the delay. The prior art circuit then takes eight measurements at times T50, T51, T52, T53, T54, T55, T56, and T57 as shown until the prior art circuit detects the I signal going back below the voltage threshold V at a time T60. The prior art circuit must then reprogram its counter with the original sample interval SI1, which takes another indeterminate amount of time, referred to as $\Delta t_{RD2}$, so that sampling does not begin until a time T62. It is clear that a substantial portion of the I input signal is missed due to the indeterminate reprogramming delays, $\Delta t_{RD1}$ and $\Delta t_{RD2}$. For example, a voltage peak 700 occurring between times T45 and T50 is completely missed due to the reprogramming delay $\Delta t_{RD1}$. It is therefore desired to eliminate such indeterminate delays due to reprogramming.

Referring now to FIG. 8, a simplified schematic diagram is shown of a measurement circuit 800 including the counter circuit 500 to provide seamless switching between the two separate scan rates SI1 and SI2 without the delays $\Delta t_{RD1}$ and $\Delta t_{RD2}$. The I signal is provided to the positive input of a comparator 802 and the voltage threshold V is provided to the negative input. The output of the comparator 802 is provided either directly as a select signal, such as the S3 signal, or into a pulse circuit 804, which asserts pulses on the GATE signal in response to transitions at the output of the comparator 802. In this manner, the GATE signal is pulsed when the I signal rises above or drops below the voltage threshold V. It is noted that only one of the register banks 502 or 504 or that only one register from each of the register banks 502, 504 is required. For this example, the registers 506 and 512 are used where the S1 and S2 signals are set to zero. The S3 signal is toggled upon successive pulses of the GATE signal as described previously for alternatively selecting between the registers 506, 512. Preliminarily, the register 506 is loaded with a first scan interval value representing scan interval SI1 and the register 512 is loaded with a second scan interval value representing scan interval SI2.

FIG. 9 shows a timing diagram for switching between the two separate scan interval rates SI1, SI2 using the measurement circuit 800 of FIG. 8 for measuring the input signal I. The S3 signal is initially asserted low for selecting the first scan interval rate in the register 506. Thus, the first scan interval from the register 506 is continuously loaded into the counter 524 as described previously while the I signal is below the voltage threshold V. The I input signal is sampled at times T100, T101, T102 and T103, which correspond to the times T40, T41, T42 and T43 shown in FIG. 7.

Eventually, the I signal rises above the voltage threshold and the pulse circuitry asserts a pulse on the GATE signal. The S3 signal is toggled and the second scan interval value SI2 from the register 512 is selected. The counter 524 reaches terminal count at a time T104 and asserts the TC signal, and the counter 524 is then loaded with the SI2 value from the register 512. Thereafter, while the S3 signal remains asserted high, the new scan interval rate associated with SI2 from the register 512 is continually loaded into the counter 524 upon successive pulses on the TC signal. The switch between registers 506 to 512 occurs almost immediately in hardware and thus there is negligible delay. The counter 524 subsequently reaches terminal count and asserts the TC signal at time T105. It is noted that the time T105 occurs almost precisely after the sample interval SI2 after the time T104 as compared to the subsequent sample taken at time T50 after the indeterminate reprogramming delay $\Delta t_{RD1}$ from the time T45 in the prior art circuit. This demonstrates the seamless switching between two separate scan rates, using the counter circuit 500 according to the present invention.

While the I input signal is above the voltage threshold V, the counter 524 is continually loaded from the register 512 for taking subsequent samples at times T106, T107, T108, T109, T110, T111, T112, T113, T114, T115 and T116. It is noted that twelve separate samples are taken of the I input signal as compared to only eight samples taken using circuitry according to prior art. Furthermore, interesting events such as a peak voltage 900, corresponding to the peak 700 in FIG. 7, is detected at a time T106 using the counter circuit 500 according to the present invention. Eventually the I input signal falls below the threshold voltage V toggling the comparator 802, which causes a pulse on the GATE signal. The S3 signal is correspondingly toggled, so that the register 506 is once again selected. However, since the conversion happens after time T116, the counter 524 continues counting down using the SI2 value until reaching terminal count at time T117. Thereafter, the circuit switches back to the original scan rate corresponding to SI1 as described previously.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

We claim:

1. A counter circuit, comprising:

a timing device receiving a timing value and asserting a completion signal, wherein said timing value sets a timing period of said timing device;

first and second registers for storing first and second timing values, respectively, for loading into said timing device, wherein said first and second timing values are stored prior to operation of said timing device using said first and second timing values; and logic receiving a trigger signal and said completion signal and coupled to said timing device and said first and second registers for providing a select signal to select between said first and second timing values and for asserting signals to load and initiate said timing device with one of either of said first and second timing values from said first and second registers based on said completion and said trigger signals, wherein said logic loads said timing device with said first timing value and then initiates said timing device in response to said trigger signal, wherein said logic then loads said timing device with said second timing value in response to said completion signal.

2. The counter circuit of claim 1, wherein said timing device is a programmable counter which asserts a terminal count signal when finished counting.

3. The counter circuit of claim 1, wherein said first timing value is a delay value and said second timing value is a scan interval value.

4. The counter circuit of claim 1, wherein said logic comprises:
multiplexer logic having inputs coupled to said first and second registers and an output for providing a selected timing value to said timing device; and
control logic receiving said trigger signal and providing a select signal to said multiplexer logic and for providing a load signal to said timing device.

5. The counter circuit of claim 1, wherein said logic selects said first timing value when said select signal is at a first logic level and selects said second timing value when said select signal is at a second logic level, and wherein said logic loads said timing device with a selected timing value each time said completion signal is asserted by said timing device.

6. The counter circuit of claim 5, wherein said first timing value corresponds to a first scan interval and wherein said second timing value corresponds to a second scan interval.

7. A counter circuit, comprising:
a timing device receiving a timing value and asserting a completion signal, wherein said timing value sets a timing period of said timing device;
first and second registers for storing first and second timing values, respectively, for loading into said timing device, wherein said first and second timing values are stored prior to operation of said timing device using said first and second timing values;
logic receiving a trigger signal and said completion signal and coupled to said timing device and said first and second registers for providing a select signal to select between said first and second timing values and for asserting signals to load and initiate said timing device with one of either of said first and second timing values from said first and second registers based on said completion and said trigger signals;
output conditioning logic coupled to said timing device for asserting a convert pulse each time said completion signal is asserted; and
a measurement circuit receiving an input signal and said convert pulse for sampling said input signal upon receiving said convert pulse.

8. The counter circuit of claim 7, wherein said measurement circuit includes an analog to digital converter which converts each sample of said input signal to a digital value.

9. The counter circuit of claim 7, wherein said timing device is a programmable counter which asserts a terminal count signal when finished counting.

10. The counter circuit of claim 7, wherein said logic loads said timing device with said first timing value and then initiates said timing device in response to said trigger signal, wherein said logic then loads said timing device with said second timing value in response to said completion signal.

11. The counter circuit of claim 10, wherein said first timing value is a delay value and said second timing value is a scan interval value.

12. A counter circuit, comprising:
a timing device receiving a timing value and asserting a completion signal, wherein said timing value sets a timing period of said timing device;
first and second registers for storing first and second timing values, respectively, for loading into said timing device, wherein said first and second timing values are stored prior to operation of said timing device using said first and second timing values, wherein said first timing value corresponds to a first scan interval and wherein said second timing value corresponds to a second scan interval;
logic receiving a trigger signal and said completion signal and coupled to said timing device and said first and second registers for providing a select signal to select between said first and second timing values and for asserting signals to load and initiate said timing device with one of either of said first and second timing values from said first and second registers based on said completion and said trigger signals, wherein said logic selects said first timing value when said select signal is at a first logic level and selects said second timing value when said select signal is at a second logic level, and wherein said logic loads said timing device with a selected timing value each time said completion signal is asserted by said timing device;
output conditioning logic coupled to said counter for asserting a convert pulse each time a terminal count signal is asserted; and
a measurement circuit receiving an input signal and said convert pulse for sampling said input signal upon receiving said convert pulse.

13. The counter circuit of claim 12, further comprising:
a comparator circuit receiving said input signal and a reference signal and asserting said trigger signal.

14. The counter circuit of claim 13, wherein said comparator circuit pulses said trigger signal when the voltage of said input signal rises above said reference signal, and pulses said trigger signal when the voltage of said input signal falls below said reference signal.

15. The counter circuit of claim 12, wherein said timing device is a programmable counter which asserts a terminal count signal when finished counting.

16. The counter circuit of claim 12, wherein said logic loads said timing device with a first timing value and then initiates said timing device in response to said trigger signal, wherein said logic then continuously loads said timing device with said second timing value in response to said completion signal.

17. The counter circuit of claim 16, wherein said first timing value is delay value and said second timing value is a scan interval value.

18. A method for operating a counter in a data acquisition system, comprising:
loading a delay value into a first register;
loading a scan interval value into a second register;
transferring the delay value from the first register into the counter after said loading the delay value into the first register and after said loading the scan interval value into said second register;

initiating operation of the counter to begin counting using said delay value;

the counter counting using said delay value;

the counter asserting a completion signal after completing said counting;

transferring the scan interval value from the second register into the counter in response to said completion signal; and the counter beginning one or more scan intervals using the scan interval value after said transferring the scan interval value from the second register into the counter.

19. A method for operating a counter in a data acquisition system, comprising:

loading a first scan interval value into a first register;

loading a second scan interval value into a second register;

transferring the first scan interval value from the first register into the counter after said loading the first scan interval value into the first register and after said loading the second scan interval value into the second register;

the counter beginning one or more scan intervals using said first scan interval value after said transferring the first scan interval value from the first register into the counter;

transferring the second scan interval value from the second register into the counter in response to an event; and the counter beginning one or more scan intervals using said second scan interval value after said transferring the second scan interval value from the second register into the counter.

20. A counter circuit, comprising:

a timing device receiving a timing value and asserting a completion signal, wherein said timing value sets a timing period of said timing device;

first and second registers for storing first and second timing values, respectively, for loading into said timing device, wherein said first and second timing values are stored prior to operation of said timing device using said first and second timing values;

logic receiving a trigger signal and said completion signal and coupled to said timing device and said first and second registers for providing a select signal to select between said first and second timing values and for asserting signals to load and initiate said timing device with one of either of said first and second timing values from said first and second registers based on said completion and said trigger signals;

output conditioning logic coupled to said counter for asserting a convert pulse each time a terminal count signal is asserted; and a measurement circuit receiving an input signal and said convert pulse for sampling said input signal upon receiving said convert pulse;

wherein: said logic selects said first timing value when said select signal is at a first logic level and selects said second timing value when said select signal is at a second logic level; said logic loads said timing device with a selected timing value each time said completion signal is asserted by said timing device; said first timing value corresponds to a first scan interval; and said second timing value corresponds to a second scan interval.

21. The counter circuit of claim 20, further comprising:

a comparator circuit receiving said input signal and a reference signal and asserting said trigger signal.

22. The counter circuit of claim 21, wherein said comparator circuit pulses said trigger signal when the voltage of said input signal rises above said reference signal, and pulses said trigger signal when the voltage of said input signal falls below said reference signal.

* * * * *